United States Patent [19]
Domae et al.

[11] Patent Number: 6,103,991
[45] Date of Patent: Aug. 15, 2000

[54] LASER MACHINING APPARATUS

[75] Inventors: Nobushige Domae; Tomoshige Saso, both of Tokyo, Japan

[73] Assignee: Advantest Corp., Tokyo, Japan

[21] Appl. No.: 09/176,405

[22] Filed: Oct. 20, 1998

[51] Int. Cl.[7] .................................................. B23K 26/36
[52] U.S. Cl. ............................... 219/121.69; 219/121.68; 219/121.83
[58] Field of Search .......................... 219/121.61, 121.62, 219/121.68, 121.69, 121.8, 121.83

[56] References Cited

U.S. PATENT DOCUMENTS

| | | | |
|---|---|---|---|
| 4,769,523 | 9/1988 | Tanimoto et al. | 219/121.62 |
| 5,414,519 | 5/1995 | Han . | |
| 5,690,846 | 11/1997 | Okada et al. . | |

FOREIGN PATENT DOCUMENTS

| | | |
|---|---|---|
| 59-99206 | 6/1984 | Japan . |
| 7-236989 | 9/1995 | Japan . |

*Primary Examiner*—Geoffrey S. Evans
*Attorney, Agent, or Firm*—Muramatsu & Associates

[57] ABSTRACT

In a laser machining apparatus for performing a laser repair process on a semiconductor wafer, fuses are selectively melted based on the result of judging. A method for aligning a laser machining apparatus for applying a laser beam for laser machining, includes the steps of: detecting a position of a first specific point for alignment provided on an object-to-be-machined; computing a position of a second specific point for alignment other than the first specific point, based on a detected position of the first specific point; detecting a position of the second specific point; and comparing the computed position of the second specific point with the detected position of the second specific point. When the difference between both positions is above a preset threshold value, the laser machining is interrupted.

14 Claims, 5 Drawing Sheets

LASER MACHINING APPARATUS

BACKGROUND OF THE INVENTION

The present invention relates to a method for aligning a laser machining apparatus, more specifically to a method for aligning a laser repair apparatus for machining a wiring pattern on a semiconductor wafer.

Recently, as semiconductor device fabrication techniques have been developed, semiconductor devices have become more integrated and have gained higher densities, and circuit patterns have become more micronized. Accordingly, circuit defects tend to increasingly occur. To improve yields of IC chips with respect to such defect increases, a repair (defect remedy) technique of forming redundant cells in advance in an IC chip for replacing a cell which has become defective has become widely used. As one example of such a repair technique, there is known a method using a laser repair apparatus, which is a laser machining apparatus. A fusing pattern-portion (fuse) is prepared in a redundant cell, and a converged laser beam is applied to the fuse to break the pattern to replace the defective cell with the redundant cell.

The repair technique using the laser repair apparatus requires accurate alignment, and the apparatus must be structured so as to ensure high alignment accuracy and allow adjustment of alignment accuracy. Adjustment of alignment accuracy is performed usually by highly-skilled specialists, and aligning operations performed during machining are automated by the apparatus. When the adjustment of alignment accuracy is correct, the alignment can be automated with high accuracy.

However, alignment accuracy is often momentarily deflected when a machining operation is being performed, but repair apparatus operators then judge a small alignment deflection to be due to the intrinsic shape of the wafer because the alignment is usually automated, and they unknowingly continue the machining operation. Eventually, a disadvantage arises in that erroneous melting of fuses successively takes place.

A technique for preventing such successive erroneous melt due to alignment accuracy deflection is disclosed in Japanese Patent Laid-Open Publication No. 236989/1995. According to this invention, differences of measured positions of a plurality of alignment marks on the surface of a wafer-to-be-machined and a chip-to-be-machined and a reference position of an alignment mark preset in the apparatus are given; whether or not the differences are within an allowable value is judged; and when the differences exceed the allowable value, an alarm signal indicating that an alignment accuracy deflection has possibly occurred is outputted to thereby prevent the successive erroneous melt.

In the actual machining, even when a reference position of an alignment mark is displaced from a position of an alignment mark on a wafer-to-be-machined, such erroneous melting does not take place if coordinates of an alignment mark are correctly recognized, and a position of a fuse-to-be-machined is correctly recognized based on the coordinates. However, although the technique disclosed in Japanese Patent Laid-Open Publication No. 236989/1995 has the advantage of preventing successive erroneous melt due to deflection of alignment accuracy of a laser repair apparatus, it has the disadvantage any misalignment of a wafer itself might be judged to be deflection of alignment accuracy of the laser repair apparatus.

SUMMARY OF THE INVENTION

An object of the present invention is to provide a method for aligning a laser machining apparatus which enables the laser machining apparatus to perform machining, not only judging alignment accuracy deflection thereof, but also in consideration of misalignment of an object-to-be-machined.

The above-described object is achieved by a method for aligning a laser machining apparatus for applying a laser beam for laser machining, comprising the steps of: detecting a position of a first specific point for alignment provided on an object-to-be-machined; computing a position of a second specific point for alignment other than the first specific point based on the detected position of the first specific point; detecting a position of the second specific point; and comparing the computed position of the second specific point with the detected position of the second specific point, and, when a difference between both positions is above a preset threshold value, interrupting the laser machining.

The above-described object is achieved by a method for aligning a laser machining apparatus for applying a laser beam for laser machining, comprising the steps of: detecting a position of a first specific point for alignment and a position of a second specific point for alignment provided on an object-to-be-machined; computing a position of the second specific point based on the detected position of the first specific point; and comparing the computed position of the second specific point with the detected position of the second specific point, and, when a difference between both positions is above a preset threshold value, interrupting the laser machining.

In the above-described method for aligning a laser machining apparatus it is possible that the first specific point is a plurality of specific points.

In the above-described method for aligning a laser machining apparatus it is possible that the object-to-be-machined is a semiconductor wafer; and the specific points are alignment marks formed on the semiconductor wafer.

In the above-described method for aligning a laser machining apparatus it is possible that the laser machining is a laser repair process for melting a fuse in a wiring pattern formed on the semiconductor wafer.

The above-described object is achieved by a laser machining apparatus for laser machining by applying a laser beam, comprising: detecting means for detecting a first specific point for alignment provided on an object-to-be-machined; computing means for computing a position of a second specific point other than the first specific point based on the detected position of the first specific point detected by the detecting means; comparing means for comparing the computed position of the second specific point with the detected position of the first second specific point, and judging whether or not a difference between both positions is above a preset threshold value; and interrupting means for interrupting the laser machining based on a result of comparison by the comparing means.

In the above-described laser machining apparatus it is possible that the apparatus further comprises alarm means for alarming based on the result of comparison by the comparing means.

In the above-described laser machining apparatus it is possible that the object-to-be-machined is a semiconductor wafer; and the specific points are alignment marks formed on the semiconductor wafer.

In the above-described laser machining apparatus it is possible that the laser machining is a laser repair process for melting a fuse in a wiring pattern formed on the wafer.

The present invention comprises the step of detecting a position of a first specific point for alignment provided on an object-to-be-machined; the step of computing a position of a second specific point for alignment other than the first specific point based on the detected position of the first specific point; the step of detecting a position of the second specific point; and the step of comparing the computed position of the second specific point with the detected position of the second specific mark, and, when a difference between both computed positions is above a preset threshold value, interrupting the laser machining, whereby erroneous machining due to deflection of alignment accuracy of the laser repair apparatus can be effectively prevented, and even with apparent deflection of alignment accuracy due to displacement of an object-to-be-machined itself, the laser repair process can be performed effectively without wastefully interrupting the laser machining process.

DETAILED DESCRIPTION OF THE INVENTION

The laser repair technique using the laser machining apparatus according to one embodiment of the present invention will be explained with reference to the drawings.

Figure 1:
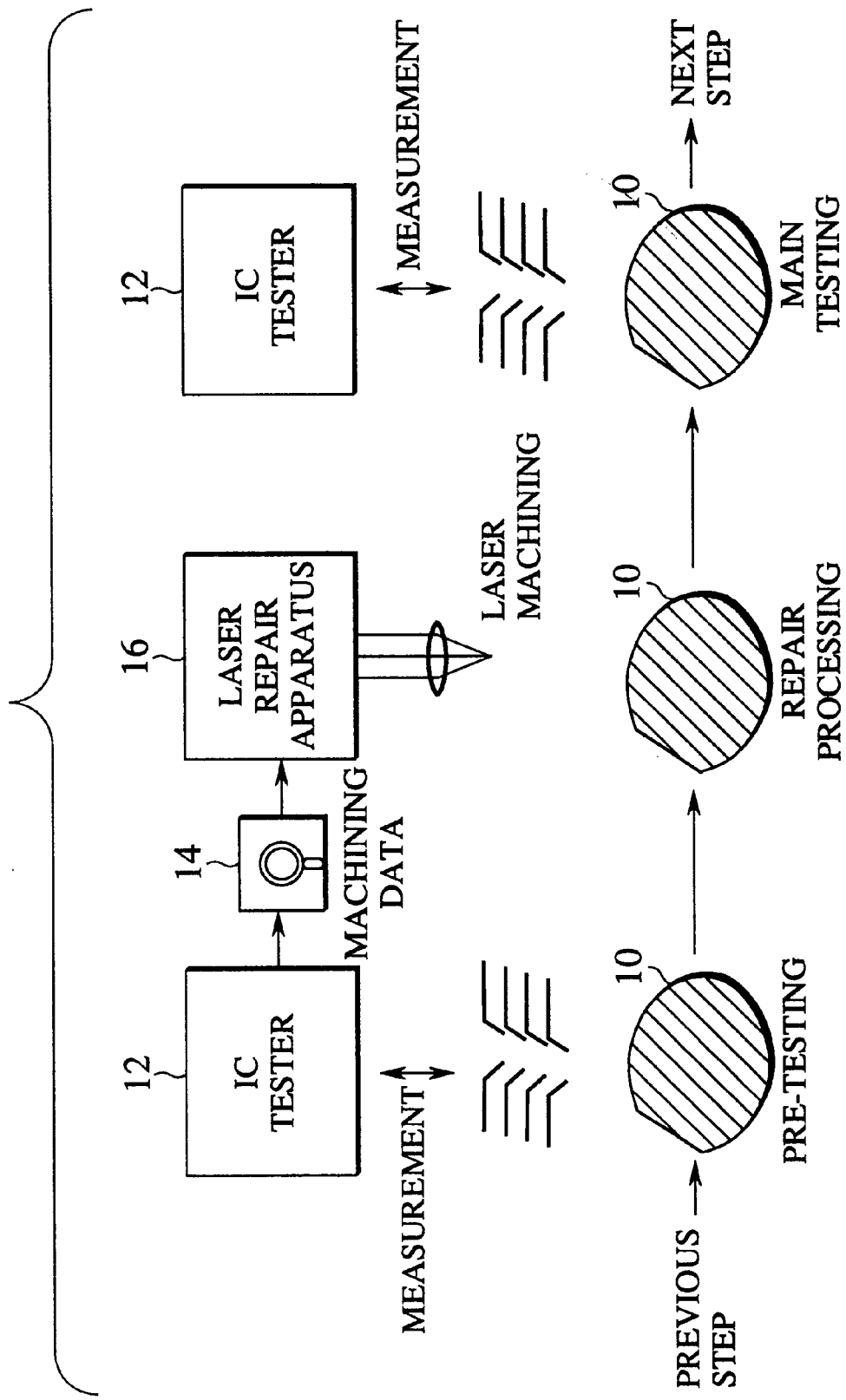
FIG. 1 is a flow chart of the laser repair process according to one embodiment of the present invention.

The general diagrammatic flow of the laser repair process will be explained with reference to FIG. 1.

Pre-measurement is performed on a wafer 10 which has been fed from a preceding step. In the pre-measurement, measurement is performed by the use of a tester 12 as to whether or not any chips in the wafer 10 are defective. Those chips which have been judged defective are divided into repairable and unrepairable ones. Each repairable chip is checked as to an address of a defective data bus. Usually an alignment mark is provided on each chip of the wafer at a set position, and the address of the defective data bus is recorded as coordinates with respect to the position of the alignment mark. Data given by the pre-measurement are stored in, e.g, a floppy disk 14.

Then, the wafer 10 is fed to a laser repair apparatus 16. The laser repair apparatus 16 reads the data recorded in the floppy disk 14 and, based on the data, melts the fuses using laser beams to replace the defective cells by redundant cells, and thus carries out the repair process.

Subsequently, a main measurement is performed on the wafer 10, which has finished the laser repair process. In the main measurement, measurement is conducted by the use of the IC tester 12 as to whether or not any chips in the wafer 10 are defective. Then, the wafer 10 is cut into individual chips, and defective chips are rejected so as to select only working chips.

Figure 2:
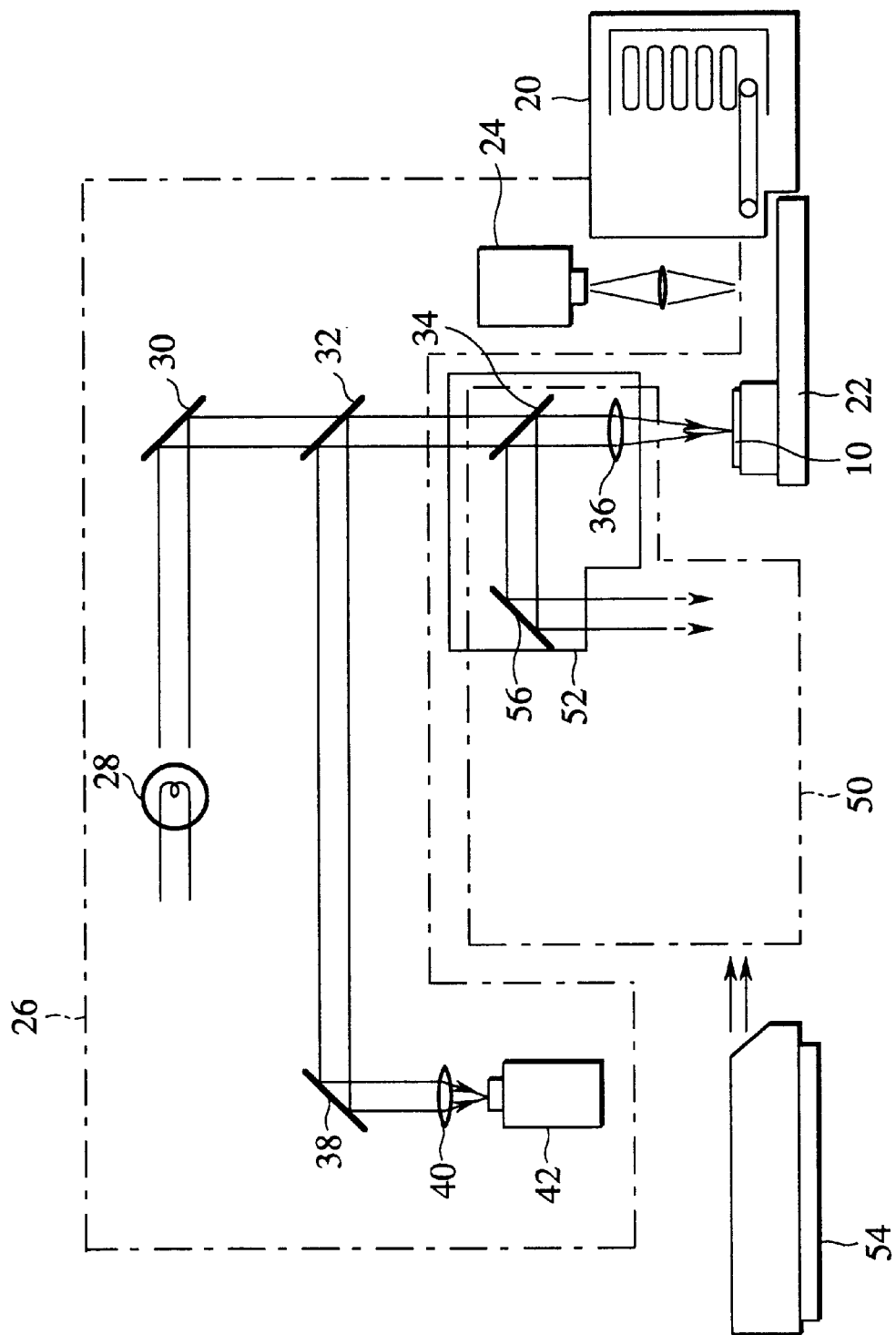
FIG. 2 is a block diagram of the laser machining apparatus according to the embodiment of the present invention.

Next, the laser machining apparatus according to the present embodiment will be summarized with reference to FIG. 2.

Wafers 10, referred to as objects-to-be-machined, are stored in set positions on the loading side of a loader/unloader 20, pre-aligned, i.e., aligned in an X, a Y and a Θ directions and are automatically transferred onto a wafer stage 22. The wafer 10 being carried is pre-aligned in the X, Y and Θ directions and carried into a working area.

The wafer 10 is precisely aligned by a detection optical system 26 for wafer alignment. In the detection optical system 26 for wafer alignment, radiation light for the alignment applied by an illumination light source 28 forms an image on the surface of the wafer 10 by an objective lens 36 for laser machining via a mirror 30 and half mirrors 32, 34. Light reflected on the surface of the wafer 10 is reflected onto the half mirror 32 via the half mirror 34 to be incident on a television camera 42 via a mirror 38 and a lens 40. The television camera 42 recognizes the image of the wafer 10. Based on a result of the image recognition, alignment deflections in the X, Y and Θ directions from a prescribed reference position of the wafer 10 are computed, and based on the computed data, the wafer stage 220 is moved to finally align the wafer 10 with the prescribed reference position.

A laser machining optical system 50 conducts laser repair process. The laser machining optical system 50 includes a beam positioner 52. The beam positioner 52 is a mechanism for moving a laser beam to a position of an arbitrary fuse of a chip in the wafer 10 for alignment with high accuracy and at high speed. For example, the beam positioner 52 is moved at high speed by a linear motor (not shown) on an X-Y stage (not shown). The position of the X-Y stage is detected by an optical linear scale (not shown). The above-described objective lens 36 is mounted on the beam positioner 52.

Positions of the wafer 10 on the wafer stage 22 and of the chips in the wafer 10 are detected by the detection optical system 26 for the wafer alignment, and are aligned with the prescribed position by movement of the wafer stage 22. Then, first a weak laser beam is applied by a laser beam oscillator 54, and the laser beam forms an image on the surface of the wafer 10 by the objective lens 36 via the laser machining optical system 50 and half mirrors 56, 34. Light reflected on the surface of the wafer 10 is detected via the half mirrors 34, 56 by the reflected light detection unit (which will be described later). The vicinity of a chip-to-be-repair processed is scanned with a weak laser beam to detect reflectivities with one or two sensors, and the position of the alignment mark is computed. Based on the deflection of the computed position of the alignment mark from a reference position of a preset alignment mark, an alignment coefficient for aligning the chip is computed. Based on data indicating the relative position of the alignment mark with respect to the fuse-to-be-machined, which is supplied by the above-described floppy disk 14, a prescribed position of the fuse with respect to the alignment reference position is computed. The laser beam emission aperture (not shown) of the beam positioner 52 is moved to the position of the fuse, and a laser beam having adequate melting power is applied to melt the required fuse.

Figure 3:
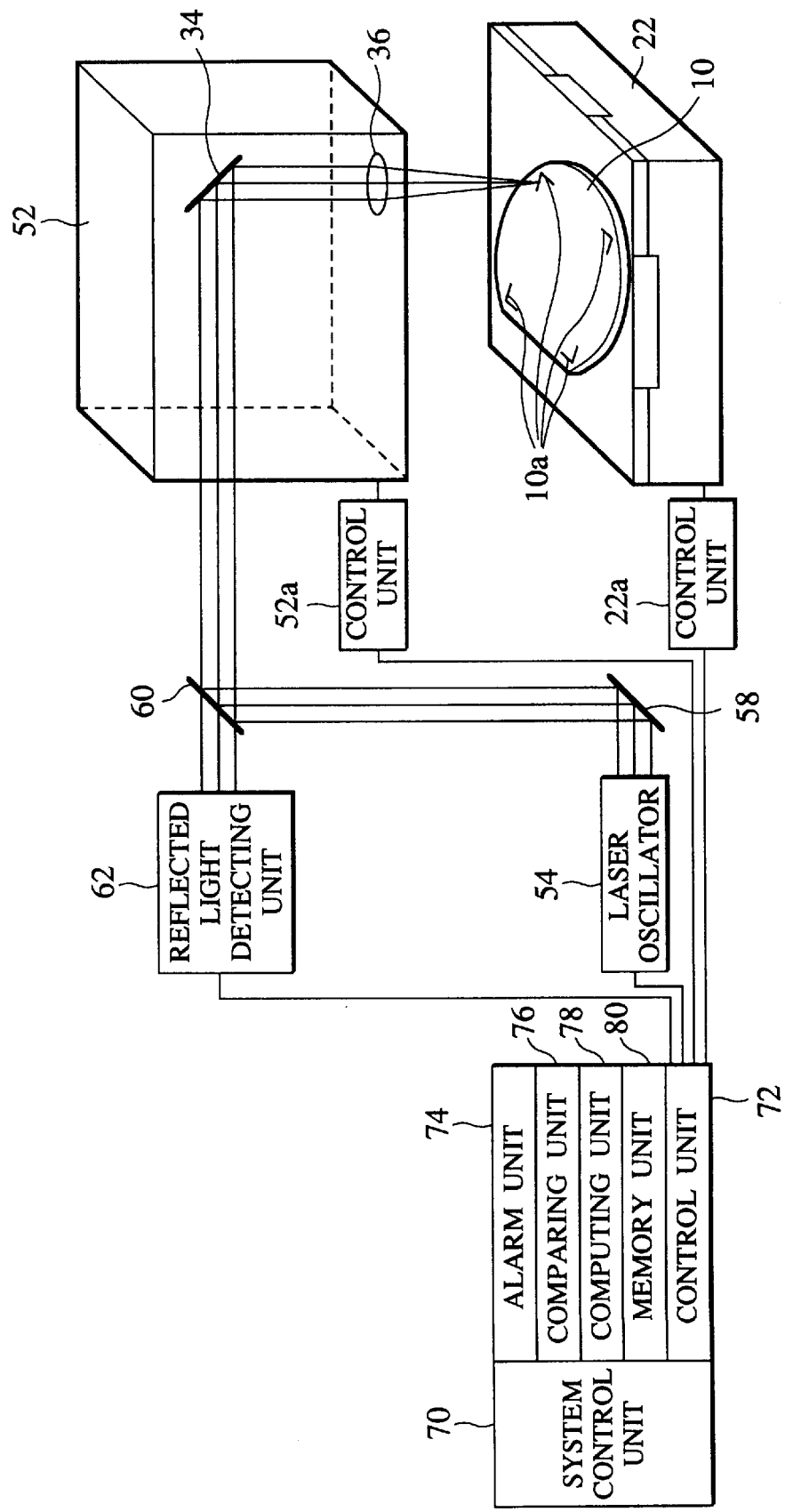
FIG. 3 is a block diagram of a major part of the laser machining apparatus according to the embodiment of the present invention.

Next, the laser machining device according to the present embodiment will be detailed with reference to FIG. 3.

A laser beam emitted by a laser oscillator 54 is incident on the beam positioner 52 via the mirror 58 and the half mirror 60. The laser beam incident on the beam positioner 52 is spotted on the surface of the wafer 10 by the objective lens 36 via the half mirror 34. The laser beam reflected on the surf ace of the half mirror 60 is reflected on the half mirror 34 and passes the half mirror 60 to be detected by the reflected beam detector 62.

A system control unit 70 f or generally controlling the laser machining apparatus is provided. The system control unit 70 includes control unit 72 for controlling the reflected beam detector 62, the laser oscillator 54, the beam positioner 52, the wafer stage 22, control unit 72 for controlling the beam positioner 52 and the wafer stage 22, and alarm unit 74, comparing unit 76, computing unit 78 and memory unit 80, which are provided for later steps. The control unit 72 of the system control unit 70 is connected to the reflected light detector 62, the laser oscillator 54, a control unit 52a of the beam positioner 52 and a control unit 22a of the wafer stage 22.

In alignment by the laser repair process of the laser machining apparatus according to the present embodiment, positions (coordinate values) of a plurality of alignment marks 10a on the wafer 10 are detected by the use of weak laser beams, and it is judged whether deflections of the detected positions of the alignment marks 100 from reference positions of the alignment marks 100 are due to deflection of alignment accuracy of the laser machining apparatus or misalignment of the wafer 10 itself. When the deflections are judged to be due to the deflection of the alignment accuracy of the laser machining apparatus, the laser repair process is interrupted. On the other hand, in a case where the deflections are judged to be due to misalignment of the wafer 10 itself, if machining precision at a machining position is within an allowable range, the laser repair process is not interrupted and is continued even when the misalignment is large. Thus, in a case where the deflections of detected positions of the alignment marks 100 are due to the deflection of alignment accuracy of the laser machining apparatus, the laser repair process is interrupted without failure, and in a case where the deflections are not due to the deflection of the laser machining apparatus but are due to the disalignment of the wafer 10 itself, the laser repair process is not interrupted and is continued.

The conventional technique has a disadvantage that displacement of alignment accuracy of the laser machining apparatus cannot be detected, and erroneous melting take place, or even mere misalignment of a wafer itself is judged to be deflection of alignment accuracy, and laser repair process is interrupted. The present embodiment can solve this disadvantage of the conventional technique.

Next, the principle of the method for aligning the laser machining apparatus according to the present embodiment will be explained with reference to FIGS. 3 and 4.

Figure 4:
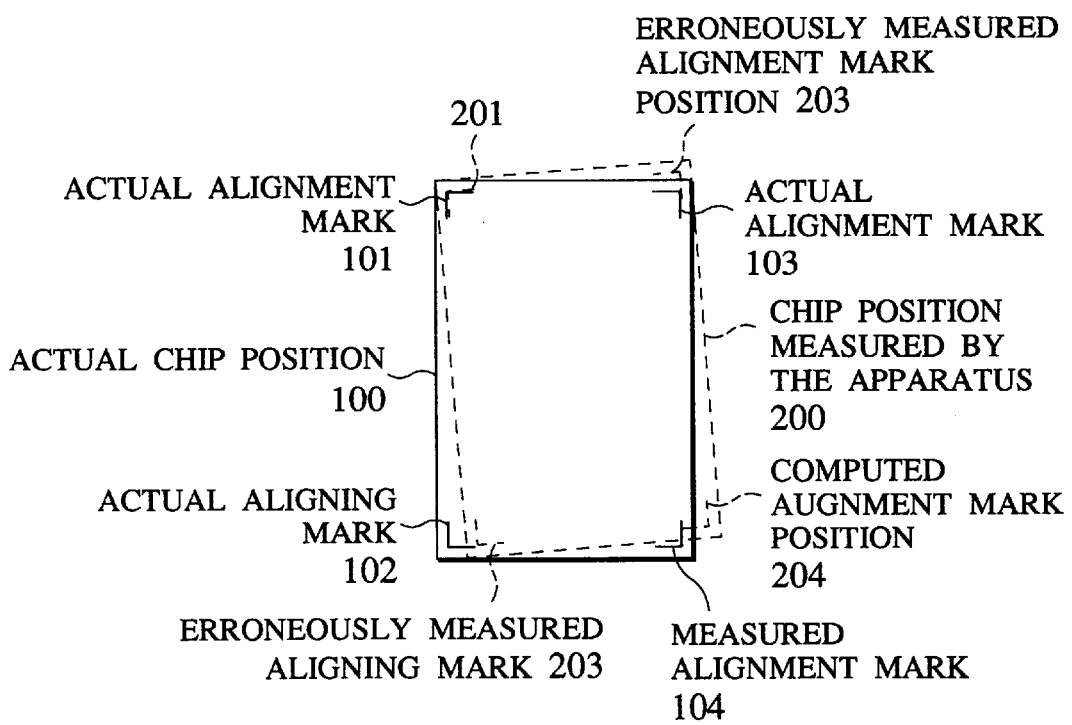
FIG. 4 is a view explaining the principle of the method for aligning the laser machining apparatus according to the embodiment of the present invention.

It is assumed that the actual chip position 100 of a chip in the wafer 10 mounted on the wafer stage 22 is indicated by the solid line in FIG. 4. Then, actual alignment marks for the chip position 100 take alignment mark positions 101. 102, 103 and 104 shown in FIG. 4.

First, positions of three of four alignment marks, which (three) are associated with the three alignment mark positions 101, 102, 103 are measured by the reflected light detecting unit 62. Measured values are stored in the memory unit 80. In the present embodiment, based on coordinates of the three measured alignment mark positions 201, 202, 203, the alignment mark position 204 of an alignment mark associated with remaining alignment mark position 104 is computed. The alignment mark position 204 is computed by the computing unit 78, based on the coordinate values of the alignment mark positions 202, 203 with the measured alignment mark position 201 agreeing in computation with the actual alignment mark position 101. The computed value is stored by the memory unit 80.

When it is assumed that the alignment mark positions 202, 203 are displaced as shown in FIG. 4 by deflection of alignment accuracy of the laser machining apparatus, the chip position 200 takes the displaced position indicated by the dash line, and the computed alignment mark position is as indicated by the reference number 204.

Subsequently, the position of the alignment mark associated with the remaining alignment mark position 104 is measured by the reflected light detecting unit 62. Measured coordinate values are stored by the memory unit 80. These measured coordinate values of the alignment mark 104 are compared by the comparing unit 76 with the coordinate values of the alignment mark 204 which have been computed before. In principle, the coordinate values of the alignment mark positions 104, 204 are compared with each other.

As a result of the comparison, if the difference between the coordinate values of the alignment mark position 104 and those of the alignment mark position 204 is above the prescribed values, it is judged that a deflection of the alignment accuracy of the laser machining apparatus has taken place, and the following laser repair process is interrupted.

On the other hand, as a result of the comparison, if the difference between the coordinate values of the alignment mark position 104 and those of the alignment mark position 204 is below the prescribed values, it is judged that no deflection of the alignment accuracy has taken place, and the laser repair process is continued.

If the reflected light detecting unit 62 has correctly measured positions of the alignment marks associated with the mark alignment positions 101, 102, 103, 104, the coordinate values of the position of the alignment mark 204 computed based on the measured alignment mark positions 201, 202, 203 will coincide with the coordinate values of the measured position of he alignment mark 204. Accordingly, when this is confirmed, even if the chip position 100 is generally displaced from the reference values, it is judged that a correct position-to-be-machined will be able to be computed, and the following laser repair process can be continued without interruption.

Even when a deflection of the alignment accuracy of the laser processing apparatus has taken place, it can be judged that the difference of the deflection is below a prescribed threshold value, and that machining accuracy at a position-to-be-machined will be within an allowable range, and the following laser repair process is continued without interruption.

In the technique disclosed by Japanese Patent Laid-Open Publication No. 236989/1995, even a deflection due to mere displacement of a mounting position of the wafer 10, or others will be mistakenly judged to be a displacement of the laser machining apparatus, and the laser repair process is interrupted.

Figure 5:
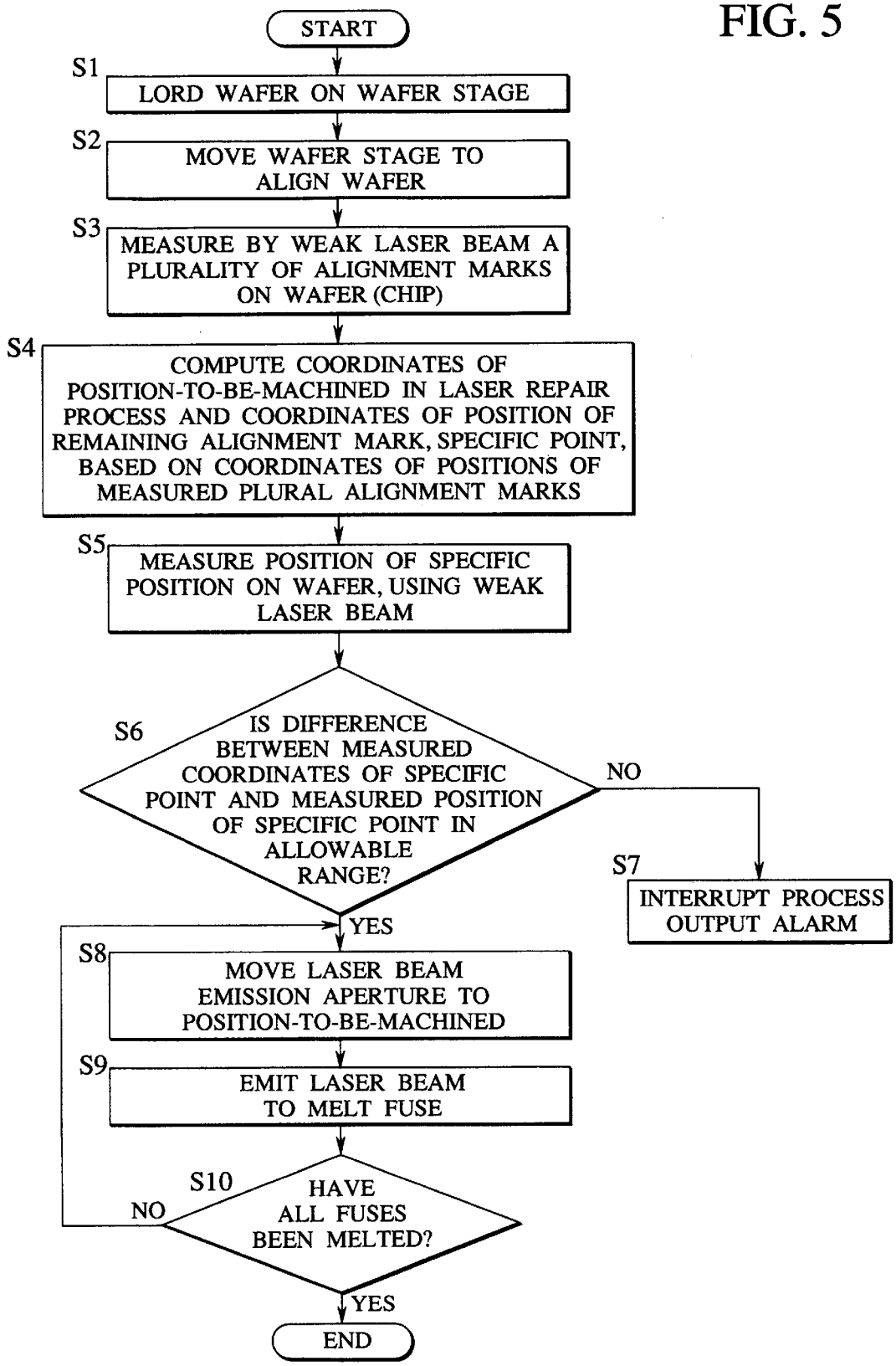
FIG. 5 is a flow chart of the method for aligning the laser machining apparatus according to the embodiment of the present invention.

Next, the laser repair process according to the present embodiment will be explained with reference to FIGS. 3 to 5.

First, a wafer-to-be-processed 10 is transferred by the loader/unloader 20 onto the wafer stage 22 (Step S1).

Then, the wafer stage 22 is moved while positions of the wafer 10 are being detected by the wafer alignment detection optical system 26 to align the wafer 10 with a preset reference position (Step S2).

Next, a weak laser beam is emitted by the laser oscillator 54. The weak laser beam is converged by the objective lens 36 via the mirror 58 and the half mirrors 60, 34 to be incident and spotted on the surface of the wafer 10. The weak laser beam is reflected on the surface of the wafer 10 backwards to be incident on the reflected light detecting unit 62 via the objective lens 36 and the half mirrors 34, 60, and positional information of the alignment marks is detected. Weak laser beams scan to measure positions 201, 202, 203 of three of four alignment marks which are specific points (Step S3). Coordinate values of the positions of the measured alignment marks 201, 202, 203 are stored by the memory unit 89.

Then, based on coordinate values of the measured alignment mark positions 201, 202, 203 of the three alignment marks, coordinate values of a position-to-be-machined in the laser repair process, and coordinate values of an alignment mark position 204 of the remaining alignment mark are computed (Step S4). The memory unit 80 stores in advance reference position data of the alignment marks, e.g., reference position data, etc., obtained in adjusting alignment accuracy. The computing unit 78 computes coordinate values of the position-to-be-machined with respect to the reference positions, using the data stored by the memory unit 80, based on: (1) the reference positions of the alignment marks; (2) the measured alignment mark positions 201, 202, 203 of the alignment marks; and (3) relative positional relationships between the position-to-be-machined (a position of a fuse to be melted) determined by measurement by the IC tester 12 and the alignment marks of the wafer 10. Concurrently therewith, the computing unit 78 computes coordinate values of an alignment mark position 204 of the remaining alignment mark, with respect to a reference position thereof, which is a specific point that has not been measured in this measurement of the wafer 10. Results thus computed are stored by the memory unit 80.

Then, a weak laser beam is emitted by the laser oscillator 54 to measure in the same way as in Step S3, the position of an alignment mark 104 of the remaining alignment mark (Step S5). Coordinate values of the measured alignment mark position 104 are stored by the memory unit 80. Step S5 may be performed concurrently with the above-described Step S3.

Then, the comparing unit 76 judges whether or not a difference between the coordinate values of the alignment mark position 204 computed in Step S4 and the coordinate values of the alignment mark position 104 computed in Step S5 is within a preset allowable range (Step S6).

In Step S6, when the judgment is "No", i.e., the difference is below a threshold value, Step S7 follows. That is, when it is judged that the difference is above the threshold value, Step S7 follows, and the control unit 72 interrupts the laser repair process, and alarm unit 74 outputs an alarm (Step S7).

In Step S6, when the judgment is "Yes", i.e., the difference is above a threshold value, Step S8 follows. That is, when it is judged that the difference is above the threshold value, Step S8 follows, and the emission aperture for the laser beams is moved to the position-to-be-machined by the beam positioner 52, based on the coordinate values of the position-to-be-machined computed in Step S4 with respect to the reference position (Step S8), and a laser beam is emitted to the position-to-be-machined to melt the fuse (Step S9).

Subsequently, it is judged whether or not all fuses to be machined have been melted (Step S10), and the process from Steps S8, S9 and S10 is repeated until all the fuses are so melted.

As described above, according to the present embodiment, erroneous machining due to deflection of alignment accuracy of the laser repair apparatus can be effectively prevented, and even with apparent deflection of alignment accuracy due to displacement of an object-to-be-machined itself, the laser repair process can be performed effectively without wastefully interrupting the laser machining process.

The present invention is not limited to the above-described embodiment and covers other various modifications thereof.

For example, in the above-described embodiment, the present invention is applied to a laser repair process for melting fuses on patterns of a semiconductor wafer. However, the process is also applicable to laser machining apparatuses for other purposes.

What is claimed is:

1. A method for aligning a laser machining apparatus for applying a laser beam for laser machining, comprising the steps of:

detecting a position of a first specific point for alignment provided on an object-to-be-machined;

computing a position of a second specific point for alignment other than the first specific point based on the detected position of the first specific point;

detecting a position of the second specific point; and comparing the computed position of the second specific point with the detected position of the second specific point, and, when a difference between both positions is above a preset threshold value, interrupting the laser machining.

2. A method for aligning a laser machining apparatus for applying a laser beam for laser machining, comprising the steps of:

detecting a position of a first specific point for alignment and a position of a second specific point for alignment provided on an object-to-be-machined;

computing a position of the second specific point based on the detected position of the first specific point; and comparing the computed position of the second specific point with the detected position of the second specific point, and, when a difference between both positions is above a preset threshold value, interrupting the laser machining.

3. A method for aligning a laser machining apparatus according to claim 1, wherein the first specific point is a plurality of specific points.

4. A method for aligning a laser machining apparatus according to claim 2, wherein the first specific point is a plurality of specific points.

5. A method for aligning a laser machining apparatus according to claim 1, wherein the object-to-be-machined is a semiconductor wafer; and the specific points are alignment marks formed on the semiconductor wafer.

6. A method for aligning a laser machining apparatus according to claim 2, wherein the object-to-be-machined is a semiconductor wafer; and the specific points are alignment marks formed on the semiconductor wafer.

7. A method for aligning a laser machining apparatus according to claim 1, wherein the laser machining is a laser repair process for melting a fuse in a wiring pattern formed on the semiconductor wafer.

8. A method for aligning a laser machining apparatus according to claim 2, wherein the laser machining is a laser repair process for melting a fuse in a wiring pattern formed on the semiconductor wafer.

9. A laser machining apparatus for laser machining by applying a laser beam, comprising:

detecting means for detecting a first specific point for alignment provided on an object-to-be-machined;

computing means for computing a position of a second specific point other than the first specific point based on the detected position of the first specific point detected by the detecting means;

comparing means for comparing the computed position of the second specific point with the detected position of the first second specific point, and judging whether or not a difference between both positions is above a preset threshold value; and interrupting means for interrupting the laser machining based on a result of comparison by the comparing means.

10. A laser machining apparatus according to claim 9, further comprising:

alarm means for alarming based on the result of comparison by the comparing means.

11. A laser machining apparatus according to claim 9, wherein the object-to-be-machined is a semiconductor wafer; and the specific points are alignment marks formed on the semiconductor wafer.

12. A laser machining apparatus according to claim 10, wherein the object-to-be-machined is a semiconductor wafer; and the specific points are alignment marks formed on the semiconductor wafer.

13. A laser machining apparatus according to claim 9, wherein the laser machining is a laser repair process for melting a fuse in a wiring pattern formed on the wafer.

14. A laser machining apparatus according to claim 10, wherein the laser machining is a laser repair process for melting a fuse in a wiring pattern formed on the wafer.

\* \* \* \* \*